(12) United States Patent
Udagawa

(10) Patent No.: US 8,026,525 B2
(45) Date of Patent: Sep. 27, 2011

(54) BORON PHOSPHIDE-BASED SEMICONDUCTOR LIGHT-EMITTING DEVICE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 1067 days.

(21) Appl. No.: 10/591,581

(22) PCT Filed: Mar. 2, 2005

(86) PCT No.: PCT/JP2005/004020
§ 371 (c)(1),
(2), (4) Date: Jan. 25, 2007

(87) PCT Pub. No.: WO2005/086240
PCT Pub. Date: Sep. 15, 2005

(65) Prior Publication Data
US 2007/0194335 A1    Aug. 23, 2007

Related U.S. Application Data

(60) Provisional application No. 60/553,531, filed on Mar. 17, 2004.

(30) Foreign Application Priority Data

Mar. 5, 2004 (JP) ................. 2004-061727

(51) Int. Cl.
*H01L 33/00* (2010.01)
(52) U.S. Cl. ............. 257/94; 257/12; 257/13; 257/79; 257/97; 257/103; 257/201; 257/E33.003; 257/E33.013; 257/E33.025; 438/47

(58) Field of Classification Search ........... 257/12, 257/13, 79, 94, 97, 103, 201, E33.003, E33.013, 257/E33.025; 438/47
See application file for complete search history.

(56) References Cited

U.S. PATENT DOCUMENTS
3,877,060 A * 4/1975 Shono et al. ............. 257/76
(Continued)

FOREIGN PATENT DOCUMENTS
DE    19605787 A1 *  1/1997
(Continued)

OTHER PUBLICATIONS

T. Udagawa, "Lattice-Matched Boronphosphide (BP) / Hexagonal GaN Heterostructure for Inhibition of Dislocation Penetration", Physica Status Solidi (c), vol. 0, Issue 7, (Dec. 2003), p. 2027-2030, Special Issue: 5th International Conference on Nitride Semiconductors (ICNS-5), Published Online: Oct. 15, 2003, [Retrieved on Jun. 6, 2005], Retrieved From the Internet: <URL: http://www3.interscience.wiley.com/cgi-bin/abstract/106558661/ABSTRACT>.

(Continued)

*Primary Examiner* — Hrayr Sayadian
(74) *Attorney, Agent, or Firm* — Sughrue Mion, PLLC

(57) ABSTRACT

A boron phosphide-based semiconductor light-emitting device includes a substrate of silicon single crystal, a first cubic boron phosphide-based semiconductor layer that is provided on a surface of the substrate and contains twins, a light-emitting layer that is composed of a hexagonal Group III nitride semiconductor and provided on the first cubic boron phosphide-based semiconductor layer and a second cubic boron phosphide-based semiconductor layer that is provided on the light-emitting layer, contains twins and has a conduction type different from that of the first cubic boron phosphide-based semiconductor layer.

14 Claims, 1 Drawing Sheet

U.S. PATENT DOCUMENTS

| | | | |
|---|---|---|---|
| 3,962,716 A * | 6/1976 | Petroff et al. | 257/190 |
| 4,033,790 A * | 7/1977 | Gunjigake et al. | 148/22 |
| 5,635,733 A * | 6/1997 | Okagawa et al. | 257/94 |
| 6,254,675 B1 * | 7/2001 | Aldinger et al. | 117/89 |
| 6,485,831 B1 * | 11/2002 | Fukushima et al. | 428/403 |
| 6,737,678 B2 * | 5/2004 | Kawakami et al. | 257/79 |
| 6,831,304 B2 * | 12/2004 | Udagawa | 257/94 |
| 6,984,851 B2 * | 1/2006 | Udagawa | 257/99 |
| 7,315,050 B2 * | 1/2008 | Udagawa | 257/103 |
| 7,465,499 B2 * | 12/2008 | Udagawa et al. | 428/446 |
| 7,646,040 B2 * | 1/2010 | Udagawa | 257/201 |
| 2001/0036678 A1 * | 11/2001 | Udagawa | 438/22 |
| 2001/0054717 A1 * | 12/2001 | Udagawa | 257/82 |
| 2002/0000563 A1 * | 1/2002 | Udagawa | 257/94 |
| 2002/0041613 A1 * | 4/2002 | Yoshida et al. | 372/46 |
| 2003/0027099 A1 * | 2/2003 | Udagawa | 433/79 |
| 2003/0047795 A1 * | 3/2003 | Udagawa | 257/628 |
| 2003/0160253 A1 * | 8/2003 | Udagawa | 257/99 |
| 2003/0178626 A1 * | 9/2003 | Sugiyama et al. | 257/79 |
| 2003/0219918 A1 * | 11/2003 | Shinohara et al. | 438/22 |
| 2003/0234400 A1 * | 12/2003 | Udagawa | 257/80 |
| 2004/0018708 A1 * | 1/2004 | Ogawa et al. | 438/592 |
| 2004/0080814 A1 * | 4/2004 | Ohki et al. | 359/344 |
| 2004/0206961 A1 * | 10/2004 | Yamada et al. | 257/79 |
| 2004/0232404 A1 * | 11/2004 | Udagawa | 257/11 |
| 2005/0121693 A1 * | 6/2005 | Udagawa et al. | 257/190 |
| 2007/0224714 A1 * | 9/2007 | Ikeda et al. | 438/26 |
| 2007/0267722 A1 * | 11/2007 | Lochtefeld et al. | 257/618 |

FOREIGN PATENT DOCUMENTS

| | | |
|---|---|---|
| JP | 2-288388 | 11/1990 |
| JP | 5-283744 | 10/1993 |
| JP | 2002076553 A * | 3/2002 |
| JP | 2003-229599 | 8/2003 |
| JP | 2003-249679 | 9/2003 |
| JP | 2003-273403 A | 9/2003 |
| JP | 2003-282941 A | 10/2003 |
| JP | 2004-22684 A | 1/2004 |
| WO | 03/065465 A2 | 8/2003 |
| WO | WO 03/065465 * | 8/2003 |

OTHER PUBLICATIONS

Kumashiro, Yukinobu et al.; Creation and Plan of BP Single Chrystal Wafer; Journal of the Japanese Association of Crystal Growth, Japan, The Japanese Association of Crystal Growth, Jul. 5, 1984, 11 (1), 25.

* cited by examiner

BORON PHOSPHIDE-BASED SEMICONDUCTOR LIGHT-EMITTING DEVICE

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/553,531 filed Mar. 17, 2004 pursuant to 35 U.S.C. §111(b).

TECHNICAL FIELD

The present invention relates to a boron phosphide-based semiconductor light-emitting device having a boron phosphide-based semiconductor layer exhibiting a wide bandgap, which device can emit high-intensity light in spite of a lattice-mismatch structure thereof.

BACKGROUND ART

Conventionally, an n-type or a p-type boron phosphide (BP)-based semiconductor layer has been employed for fabricating light-emitting diodes (LEDs) and laser diodes (LDs). For example, JP-A HEI 5-283744 discloses that a blue-LED is fabricated from a semiconductor structure including a silicon substrate, and an n-type BP layer to which silicon (Si) has been intentionally added and an aluminum gallium nitride (AlGaN) layer successively formed on the substrate. The prior art also discloses that a magnesium (Mg)-doped p-type BP layer is employed as a contact layer for fabricating an LED (see paragraph [0023] in the prior art).

As mentioned above, boron phosphide exhibiting a bandgap of 2.0 eV at room temperature is employed in combination with a Group III nitride semiconductor, such as $Al_XGa_YIn_{1-X-Y}N$ ($0 \leq X \leq 1$, $0 \leq Y \leq 1$), for fabricating a compound semiconductor light-emitting device (see, for example, JP-A HEI 2-288388). In the aforementioned LED emitting blue light of a wavelength corresponding to such a wide bandgap, a boron phosphide layer specifically serves as a base layer on which a Group III nitride semiconductor layer is grown, rather than as a cladding layer or a similar layer (see paragraph [0013] in JP-A HEI 5-283744).

In the case where a boron phosphide layer serving as a base layer is formed on a crystalline substrate, such as a silicon single-crystal substrate, it is known that the plane orientation of a surface of an epitaxially grown boron phosphide layer is determined in accordance with the crystal plane orientation of the surface of the substrate. For example, JP-A HEI 5-283744 discloses in paragraph [0025] that a (100) boron phosphide layer is grown on a (100) crystal plane of a silicon substrate and that a cubic AlGaInN layer is grown on the (100) crystal plane of the (100) boron phosphide layer. On the other hand, it is known that a (111) boron phosphide layer is grown on a (111) crystal plane of the silicon substrate and that a hexagonal AlGaInN layer is grown on the (111) crystal plane of the (111) boron phosphide layer.

The cubic AlGaInN, which is a promising candidate for a light-emitting layer or a similar layer, has a crystal structure less stable than that of a hexagonal Group III nitride semiconductor (see paragraph [0002] in JP-A HEI 5-283744). Thus, the cubic semiconductor cannot be formed in a stable state as compared with a hexagonal Group III nitride semiconductor, which is problematic.

As mentioned above, efforts have been made for growing a hexagonal AlGaInN layer having a more stable crystal structure on the (111) crystal plane of the boron phosphide layer formed on the (111) crystal plane of the silicon substrate. However, a portion in the hexagonal crystalline layer containing no cubic crystals is formed only in a limited portion from the junction interface with the boron phosphide base layer to the thickness less than 50 nm (see paragraph [0025] in JP-A HEI 5-283744).

In other words, even though it is intended that a hexagonal Group III nitride semiconductor layer is formed in a sufficient thickness on a boron phosphide-based semiconductor layer having a (111) silicon substrate, actual formation of the semiconductor layer is problematically difficult.

The present invention has been accomplished in view of the foregoing. Thus, an object of the present invention is to provide a boron phosphide-based semiconductor light-emitting device in which a high-crystallinity, hexagonal Group III semiconductor layer is formed in a sufficient thickness on a boron phosphide-based semiconductor layer provided on a silicon substrate, leading to manifestation of high emission intensity.

DISCLOSURE OF THE INVENTION

To attain the above object the present invention provides a boron phosphide-based semiconductor light-emitting device comprising a substrate of silicon single crystal, a first cubic boron phosphide-based semiconductor layer that is provided on a surface of the substrate and contains twins, a light-emitting layer that is composed of a hexagonal Group III nitride semiconductor and provided on the first cubic boron phosphide-based semiconductor layer and a second cubic boron phosphide-based semiconductor layer that is provided on the light-emitting layer, contains twins and has a conduction type different from that of the first cubic boron phosphide-based semiconductor layer.

In the first mentioned device, the substrate is a (111)-silicon single-crystal substrate having a (111) crystal plane, and the first cubic boron phosphide-based semiconductor layer is provided on the (111) crystal plane.

In the second mentioned device, the first cubic boron phosphide-based semiconductor layer has a [110] direction aligned with a [110] direction of the silicon single crystal.

In the second or third mentioned device, the first cubic boron phosphide-based semiconductor layer contains (111) twins having a (111) crystal plane serving as a twinning plane in a junction area in contact with the (111) crystal plane of the (111)-silicon single-crystal substrate.

In any one of the first to fourth mentioned devices, the first cubic boron phosphide-based semiconductor layer is an undoped layer to which no impurity element has been intentionally added.

In any one of the first to fifth mentioned devices, the light-emitting layer has a [−2110] direction aligned with a [110] direction of the first cubic boron phosphide-based semiconductor layer and has a (0001) crystal plane serving as a front surface.

In any one of the first to sixth mentioned devices, the light-emitting layer has a profile of phosphorus atom concentration that gradually decreases from a bottom thereof in a thickness direction.

In the sixth mentioned device, the second cubic boron phosphide-based semiconductor layer has a [110] direction aligned with the [−2110] direction of the light-emitting layer.

In any one of the sixth to eighth mentioned devices, the second cubic boron phosphide-based semiconductor layer contains (111) twins having a (111) crystal plane serving as a twinning plane in a junction area in contact with the (0001) crystal plane of the light-emitting layer.

In any one of the sixth to ninth mentioned devices, the second cubic boron phosphide-based semiconductor layer is an undoped layer to which no impurity element has been intentionally added.

In any one of the first to tenth mentioned devices, the first and second cubic boron phosphide-based semiconductor layers exhibit a bandgap at room temperature of 2.8 eV or more.

In any one of the first to eleventh mentioned devices, the first and second cubic boron phosphide-based semiconductor layers are provided so as to serve as cladding layers.

In any one of the first to eleventh mentioned devices, the second cubic boron phosphide-based semiconductor layer is provided so as to serve as a window layer which allows passage of light emitted from the light-emitting layer to the outside.

In any one of the first to eleventh mentioned devices, the second cubic boron phosphide-based semiconductor layer is provided so as to serve as a current-diffusion layer which allows device operation current to diffuse.

In any one of the first to eleventh mentioned devices, the second cubic boron phosphide-based semiconductor layer is provided so as to serve as a contact layer for forming an electrode.

The boron phosphide-based semiconductor light-emitting device according to the present invention is composed of a silicon single-crystal substrate, a first cubic boron phosphide-based semiconductor layer that is provided on a surface of the silicon single-crystal substrate and contains twins, a light-emitting layer that is composed of a hexagonal Group III nitride semiconductor and provided on the first cubic boron phosphide-based semiconductor layer and a second cubic boron phosphide-based semiconductor layer that is provided on the light-emitting layer and contains twins. In other words, upon growth of the first cubic boron phosphide-based semiconductor layer on the silicon-single crystal substrate that is highly lattice-mismatched with the layer, twins are incorporated into the junction area of the first cubic boron phosphide-based semiconductor layer, whereby lattice mismatch between the layer and the substrate can be mitigated. Then, a hexagonal Group III nitride semiconductor light-emitting layer is provided on the first cubic boron phosphide-based semiconductor layer whose lattice-mismatch has been mitigated. Therefore, the thus formed light-emitting layer has excellent crystallinity and can possess a sufficient layer thickness, thereby attaining manifestation of high emission intensity.

Upon growth of a second cubic boron phosphide-based semiconductor layer on the hexagonal Group III nitride semiconductor light-emitting layer, twins are incorporated into the junction area of the second cubic boron phosphide-based semiconductor layer, whereby lattice mismatch between the light-emitting layer and the second cubic boron phosphide-based semiconductor layer can be mitigated, thereby reducing lattice mismatch of the second cubic boron phosphide-based semiconductor layer. Thus, a light-emitting device exhibiting excellent blocking voltage characteristics with few local breakdowns can be fabricated.

The above and other objects, characteristic features and advantages of the present invention will become apparent to those skilled in the art from the description to be made herein below with reference to the accompanying drawing.

BEST MODES FOR CARRYING OUT THE INVENTION

Figure 1:
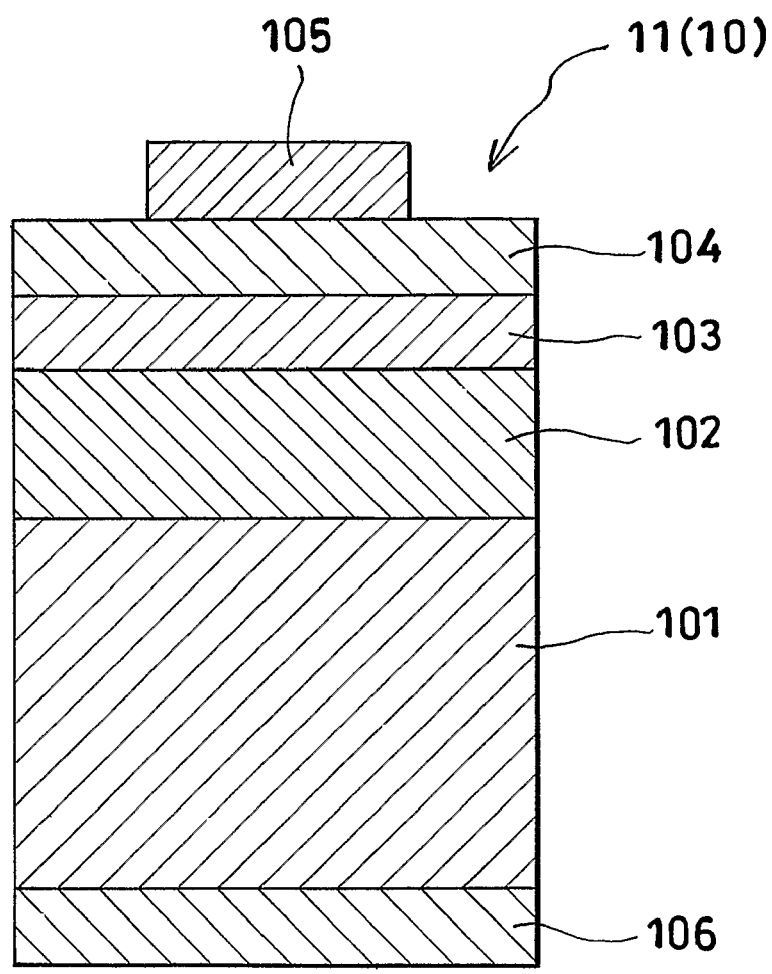
FIG. 1 is a schematic cross-sectional view of a stacked structure employed for fabricating an LED according to the present invention having a double-hetero (DH) junction structure.

Embodiments for carrying out the present invention will next be described in detail.

The boron phosphide-based semiconductor employed in the present invention contains, as essential elements, boron (B) and phosphorus (P). Examples thereof include $B_\alpha Al_\beta Ga_\gamma In_{1-\alpha-\beta-\gamma}P_{1-\delta}As_\delta$ ($0<\alpha\leq1$, $0\leq\beta<1$, $0\leq\gamma<1$, $0<\alpha+\beta+\gamma\leq1$, $0\leq\delta<1$), $B_\alpha Al_\beta Ga_\gamma In_{1-\alpha-\beta-\gamma}P_{1-\delta}N_\delta$ ($0<\alpha\leq1$, $0\leq\beta<1$, $0\leq\gamma<1$, $0<\alpha+\beta+\gamma\leq1$, $0\leq\delta<1$), boron monophosphide (BP), boron phosphide, gallium indium boron phosphide ($B_\alpha Ga_\gamma In_{1-\alpha-\gamma}P$ ($0<\alpha\leq1$, $0\leq\gamma<1$)) and mixed crystal compounds containing a plurality of Group V elements, such as boron nitride phosphide ($BP_{1-\delta}N_\delta$ ($0\leq\delta<1$)) and boron arsenide phosphide ($B_\alpha P_{1-\delta}As_\delta$ ($0\leq\alpha\leq1$, $0\leq\delta\leq1$))

According to the Grimm-Sommerfeld's rule (see Lecture of Basic Industrial Chemistry 5, Inorganic Industrial Chemistry, published by Asakura Shoten, 6th edition, p. 220, Feb. 25 (1973)), a Group III-V compound semiconductor composed of a Group III element, such as aluminum (Al) or gallium (Ga), and a Group V element, such as phosphorus (P) or arsenic (As), may take either cubic sphalerite crystal form or hexagonal wurtzite crystal form. Conventionally, hexagonal boron phosphide is employed as a base layer for growing a Group III nitride semiconductor layer (see the aforementioned JP-A HEI 5-283744). However, according to the present invention, a boron phosphide-based semiconductor light-emitting device is fabricated from a boron phosphide semiconductor layer of cubic sphalerite crystal form. In cubic sphalerite semiconductor crystals, energy levels on the valence band side are degenerated. Therefore, as compared with wurtzite semiconductor crystals, cubic sphalerite semiconductor crystals readily provide a p-type conductor layer suitable for a cladding layer or a similar layer.

The present invention employs a silicon single-crystal substrate having a diamond-type crystal structure that is identical to the crystal structure of a boron phosphide-based semiconductor layer of cubic sphalerite crystal form in order to ensure formation of the boron phosphide-based semiconductor layer of cubic sphalerite crystal form. On a silicon (Si) crystal substrate, a boron phosphide-based semiconductor layer is formed through the halogen method, the hydride method, MOCVD (metal-organic chemical vapor deposition) or a similar method. Alternatively, molecular-beam epitaxy may also be employed. In an exemplary procedure, a boron monophosphide layer is formed through MOCVD by use of triethylborane ($(C_2H_5)_3B$) and phosphine ($PH_3$).

Even though the surface of a silicon single-crystal substrate has a crystal plane orientation other than (111) (e.g., (100) or (110)), a (111) boron phosphide-based semiconductor layer having a stacked (111) crystal plane structure can be readily formed when the source supply ratio (i.e., V/III ratio) at film formation is increased during growth of the boron phosphide-based semiconductor layer through the aforementioned vapor growth means. However, if a (111) silicon single-crystal substrate is employed from the beginning, a (111) boron phosphide-based semiconductor layer can be grown even at a low V/III ratio. Therefore, in the present invention, a (111) silicon single-crystal substrate having a surface with a (111) crystal plane is employed as a substrate. The (111) silicon single crystal has a first conduction type. When a stacked structure for use in light-emitting devices is fabricated, a boron phosphide-based semiconductor layer having a first conduction type is deposited on the silicon single-crystal substrate of the first conduction type.

Through employment of a (111) silicon single-crystal substrate having a surface with a (111) crystal plane, a (111) boron phosphide-based semiconductor layer can be grown even at a low V/III ratio. The single-crystal substrate is advantageous for forming a p-type BP layer in an undoped state. For example, even when MOCVD is performed at a V/III ratio ($PH_3/(C_2H_5)_3B$ supply ratio) as low as 10 to 50, a p-type (111) boron phosphide-based semiconductor layer can be readily grown at 1,000° C. to 1,200° C. In addition to the growth temperature and V/III ratio, through precise control of growth rate, a (111) boron phosphide-based semiconductor layer having a wide bandgap can be formed on a (111) silicon single-crystal substrate. The growth rate is suitably controlled to 2 to 30 nm/min.

During vapor-phase growth of a (111) boron phosphide-based semiconductor layer (e.g., a boron monophosphide layer) on a (111) silicon single-crystal substrate, when the growth rate at an initial growth stage is increased, twins are effectively generated in a region in the vicinity of the junction with the substrate. In the case where the lattice mismatch degree with respect to the silicon single crystal is larger, twins are readily generated in a junction region in contact with the substrate without greatly increasing the growth rate. For example, in a junction region between a silicon single crystal (lattice constant=5.4309 Å) and boron phosphide (lattice constant=4.5383 Å) (i.e., lattice mismatch degree of about 16.4%), twins can be generated at a growth rate of 20 nm/min and an areal density of about $5 \times 10^{11}$ cm$^{-2}$. The areal density of twins decreases in the thickness direction from the bottom of the boron phosphide-based semiconductor layer. The areal density of twins can be determined through, for example, counting the number of twins within a predetermined region in a cross-section TEM image captured under a transmission electron microscope.

The twins generated in the junction region can mitigate lattice mismatch between the silicon single-crystal substrate and the boron phosphide-based semiconductor layer, thereby providing a boron phosphide-based semiconductor layer having excellent crystallinity. In the cubic sphalerite boron phosphide-based semiconductor layer, the twins preferably have a (111) crystal plane serving as a twining plane. Among twins, (111) twins are particularly effective for mitigating lattice mismatch between the (111) silicon single-crystal substrate and the boron phosphide-based semiconductor layer. The presence or absence of (111) twins in the boron phosphide semiconductor layer can be observed on the basis of anomalous diffraction spots in an electron-beam diffraction image.

The (111) boron phosphide-based semiconductor layer whose crystallinity has been enhanced through generation of (111) twins and which exhibits a wide bandgap may be employed in a compound semiconductor light-emitting device as a barrier layer, such as a cladding layer. Particularly, a boron phosphide-based semiconductor layer exhibiting a bandgap at room temperature of 2.8 eV or more, desirably 3.5 eV or more is preferably employed. For example, the cladding layer is preferably formed from a low-resistance boron phosphide-based semiconductor layer having, at room temperature, a carrier concentration of $1 \times 10^{19}$ cm$^{-3}$ or more and a resistivity of $5 \times 10^{-2}$ Ω·cm or less. The p-type boron phosphide-based semiconductor layer for forming the cladding layer preferably has a thickness of 50 to 5,000 nm.

A cladding layer or a similar layer that is composed of a (111) boron phosphide-based semiconductor and formed on a (111) silicon single-crystal substrate is effective for forming thereon a hexagonal wurtzite Group III nitride semiconductor layer. On a boron phosphide-based semiconductor layer having a surface with a (111) crystal plane, a light-emitting layer having a crystal plane orientation of (0001), e.g., gallium indium nitride ($Ga_XIn_{1-X}N$ ($0 \leq X \leq 1$)) or gallium nitride phosphide ($GaN_{1-Y}P_Y$ ($0 \leq Y \leq 1$)) can be grown. $Ga_XIn_{1-X}N$ ($0 \leq X \leq 1$) or a similar semiconductor in which the [−2110] direction (a-axis) of bottom plane lattice is aligned with the [110] direction of a (111) boron phosphide-based semiconductor layer is suitable for forming a light-emitting layer. When the $Ga_XIn_{1-X}N$ has a multi-phase structure including a plurality of phases having different indium compositions (=1−X), a boron phosphide-based semiconductor light-emitting device exhibiting higher emission intensity is effectively produced.

When forming a light-emitting layer of a Group III nitride semiconductor, with the phosphorus atom concentration decreased in a direction from the first cubic boron phosphide-based semiconductor layer (on the substrate) to the second cubic boron phosphide-based semiconductor layer (on the light-emitting layer), the formed light-emitting layer exhibits excellent adhesion to the first cubic boron phosphide-based semiconductor layer and emits high-intensity light. For example, after completion of vapor-phase growth of the first boron phosphide-based semiconductor layer, a phosphorus (P) source gas employed for the growth is gradually discharged to the outside of the growth system, while a nitrogen source gas for growing a Group III nitride semiconductor layer serving as a light-emitting layer is gradually supplied into the growth system, whereby a light-emitting layer having a graded phosphorus atom concentration can be formed. In this case, the period of time for discharging the phosphorus source to the outside of the growth system, is kept prolonged, the phosphorus atom concentration decrease profile in the light-emitting layer becomes gentle. The phosphorus atom concentration at the bottom (on the first boron phosphide-based semiconductor layer side) of the light-emitting layer is preferably $5 \times 10^{18}$ cm$^{-3}$ to $2 \times 10^{20}$ cm$^{-3}$ from the viewpoint of adhesion between the two layers. The phosphorus atom concentration at the top (on the second boron phosphide-based semiconductor layer side) of the light-emitting layer is preferably controlled to $5 \times 10^{19}$ cm$^{-3}$ or less from the viewpoint of emission intensity. The phosphorus atom concentration profile in the light-emitting layer may be determined through secondary ion mass spectrometric analysis (SIMS) or a similar method.

The (0001) crystal plane of the wurtzite Group III nitride semiconductor layer having the aforementioned orientation conditions is effective for forming thereon a (111) cubic boron phosphide-based semiconductor layer. When a (0001) Group III nitride semiconductor layer (e.g., a GaN layer having a (0001) surface) is employed, a (111) boron phosphide-based semiconductor layer can be readily grown in a "double positioning" manner (see P. HIRSCH et al., "ELECTRON MICROSCOPY OF THIN CRYSTAL," Krieger Pub. Com. (1977, U.S.A.), p. 306). A (111) boron phosphide-based semiconductor layer in which the [110] direction is aligned with the [−2110] direction exhibits less lattice strain and is effectively employed as a cladding layer or a window layer which allows passage of visible light (blue light, green light, etc.) to the outside of a light-emitting device.

Upon growth of a (111) boron phosphide-based semiconductor layer on a surface of a (0001) Group III nitride semiconductor layer, when (111) twins are incorporated into a junction region, a (111) boron phosphide-based semiconductor layer having remarkably excellent crystallinity can be formed. In order to form twins in the junction region, the growth rate of the (111) boron phosphide-based semiconductor layer is modified. Specifically, in contrast to the case in which a (111) boron phosphide-based semiconductor layer is grown on the (111) silicon single-crystal substrate, the growth rate at an initial growth stage is reduced. For example, the growth rate is preferably 2 to 10 nm/min. When the growth rate is gradually elevated as the increase in layer thickness (e.g., to 20 to 30 nm/min) to thereby grow a boron phosphide-based semiconductor layer in a short period of time, loss of highly volatile element, such as phosphorus (P), is prevented, and a boron phosphide-based semiconductor layer having a conduction type and carrier concentration of interest can be obtained.

The (111) boron phosphide-based semiconductor layer exhibiting a wide bandgap provided on the (0001) Group III nitride semiconductor layer may be employed as a cladding layer, a window layer or a contact layer. When the bandgap is in excess of about 5 eV, the energy level gap between the semiconductor layer and the light-emitting layer excessively increases, and production of a boron phosphide-based semiconductor light-emitting device exhibiting low forward voltage or low threshold voltage is impaired, although it is advantageous for transmitting emitted light. The bandgap can be determined on the basis of wavelength dispersibility of refractive index and extinction coefficient. Regardless of the type of the layer (i.e., cladding layer, window layer or contact layer), an undoped boron phosphide-based semiconductor layer to which no impurity element is intentionally added is effective for preventing unwanted modification of other layers caused by diffusion of a doped impurity element.

The boron phosphide-based semiconductor light-emitting device of the present invention is fabricated by providing an ohmic electrode of a first polarity on a surface of a cladding layer, a window layer or a contact layer, each composed of the boron phosphide-based semiconductor layer containing the aforementioned twins, and by providing an ohmic electrode of a second polarity on the backside of a silicon single-crystal substrate or a similar layer. On an n-type boron phosphide-based semiconductor layer, an n-type ohmic electrode may be formed from gold-germanium (Au—Ge) alloy or a similar material, whereas on a p-type boron phosphide-based semiconductor layer, a p-type ohmic electrode may be formed from gold-zinc (Au—Zn) alloy, gold-beryllium (Au—Be) alloy or nickel (Ni) alloy. When a wide-area LED having a side length of 500 μm or longer is fabricated, it is effective that a plurality of small, circular (e.g., diameter: 20 to 50 μm) ohmic electrodes are provided over a wide area of the boron phosphide-based semiconductor layer surface, and these electrodes are electrically connected to one another. Through employment of the electrode configuration, device operation current can be diffused over a wide surface of the layer, which is advantageous for fabricating LEDs exhibiting high emission intensity or having wide emission area.

EXAMPLES

The present invention will next be described in detail, with reference to fabrication of a boron phosphide-based LED including a (111) boron phosphide (BP) layer formed on a (111) silicon single-crystal substrate and a (0001) gallium indium nitride light-emitting layer formed on the (111) BP layer.

FIG. 1 schematically shows a cross section of a stacked structure employed for fabricating an LED according to the present invention having a double-hetero (DH) junction structure. In FIG. 1, a stacked structure 11 is provided for fabricating an LED chip 10.

The stacked structure 11 was formed by sequentially stacking on a phosphorus-doped n-type (111) silicon (Si) single-crystal substrate 101 an undoped n-type (111) boron phosphide lower cladding layer 102, a multi-quantum well structure light-emitting layer 103 including repeatedly (3 times) stacked an n-type (0001) gallium indium nitride ($Ga_{0.90}In_{0.10}N$) well layer and a (0001) gallium nitride barrier layer, and an undoped p-type (111) boron phosphide upper cladding layer 104.

The bottom layer in the light-emitting layer 103 which was in contact with the lower cladding layer 102 was a well layer, and on the well layer, a barrier layer, a well layer, a barrier layer, a well layer and a barrier layer were sequentially stacked. The uppermost barrier layer was in contact with the upper cladding layer 104.

The undoped n-type (111) boron phosphide layer (lower cladding layer 102) and the undoped p-type (111) boron phosphide layer (upper cladding layer 104) were formed through a normal pressure (near atmospheric pressure) metal-organic vapor phase epitaxy (MOVPE) means by use of tri-ethylborane $((C_2H_5)_3B)$ as a boron source and phosphine ($PH_3$) as a phosphorus source. The n-type (111) boron phosphide layer (lower cladding layer 102) and the p-type (111) boron phosphide layer (upper cladding layer 104) were formed at 925° C. and 1,025° C., respectively. The light-emitting layer 103 was formed through a trimethylgallium $((CH_3)_3Ga)/NH_3/H_2)$ reaction atmospheric pressure MOCVD means at 800° C. The aforementioned gallium indium nitride layer forming the well layers had a multi-phase structure including a plurality of phases having different indium compositions. The average indium composition was found to be 0.10 (=10%). Each well layer had a thickness of 5 nm, and each barrier layer had a thickness of 10 nm.

In an initial stage of growing a (111) boron phosphide layer serving as a lower cladding layer 102 on the surface of the (111) silicon single-crystal substrate 101, the growth rate was controlled to 25 nm/min. Until the layer thickness reached 50 nm, growth was performed at the same rate. Subsequently, the growth rate was reduced to 20 nm/min and the growth was continued until the total layer thickness reached 600 nm. On the other hand, in an initial stage of growing the upper cladding layer 104 on the light-emitting layer 103 composed of a (0001) Group III nitride semiconductor, the growth rate was controlled to 10 nm/min and then the growth rate was increased to 20 nm/min, thereby growing the p-type upper cladding layer 104 having a total thickness of 200 nm. A portion of the layer grown at a low growth rate of 10 nm/min had a thickness of 25 nm.

The undoped n-type (111) boron phosphide layer serving as the lower cladding layer 102 was found to have a carrier (electron) concentration of $6 \times 10^{19}$ $cm^{-3}$ and a resistivity at room temperature of $8 \times 10^{-3}$ $\Omega \cdot cm$. The undoped p-type (111) boron phosphide layer serving as the upper cladding layer 104 was found to have a carrier (hole) concentration of $2 \times 10^{19}$ $cm^{-3}$ and a resistivity at room temperature of $5 \times 10^{-2}$ $\Omega \cdot cm$.

The bandgap at room temperature was determined on the basis of photon energy dependency of a doubled value (=2n·k) of the product (=n·k) of refractive index (n) and extinction coefficient (k) As a results, the n-type (111) boron phosphide layer serving as the lower cladding layer 102 was found to have a bandgap of 3.1 eV, and the p-type (111) boron phosphide layer serving as the upper cladding layer 104 was found to have a bandgap of 4.2 eV. Thus, the upper cladding layer 104 composed of p-type boron phosphide was regarded as a candidate for a p-type cladding layer also serving as a window layer for transmitting light emitted from the light-emitting layer 103.

A selective area electron-beam diffraction (SAD) pattern obtained from an inside portion of the n-type (111) boron phosphide layer corresponding to a junction area between the (111) silicon single-crystal substrate 101 and the lower cladding layer 102 (i.e., a portion from the junction interface with the substrate 101 to a thickness of 50 nm of the n-type boron phosphide layer) contained anomalous diffraction spots attributed to (111) twin crystals. These anomalous spots were regularly patterned between {111} diffraction spots and had a spacing ⅓ that of {111} diffraction spots, indicating that these twins were identified as (111) twins.

Another selective area electron-beam diffraction (SAD) pattern obtained from an inside portion of the p-type (111) boron phosphide layer corresponding to a junction area between the (0001) Group III nitride semiconductor light-emitting layer 103 and the upper cladding layer 104 (i.e., a portion from the junction interface with the multi-quantum well structure light-emitting layer 103 to a thickness of 25 nm of the p-type boron phosphide layer) also contained anomalous diffraction spots attributed to twin crystals. Thus, (111) twins were observed in both junction regions.

The lattice image of each of the aforementioned junction regions was captured through a conventional cross-section TEM technique, and the number of (111) twins was counted from the image. The areal density of (111) twins in a region in the vicinity of the junction interface between the (111) silicon single-crystal substrate 101 and the n-type lower cladding layer 102 was found to be about $6 \times 10^{11}$ cm$^{-2}$. The areal density of (111) twins gradually decreased in the thickness direction, and was found to be $7 \times 10^8$ cm$^{-2}$ in a region in the vicinity of the surface of the n-type lower cladding layer 102.

The areal density of (111) twins in the p-type (111) boron phosphide layer corresponding to the junction region between the (0001) Group III nitride semiconductor light-emitting layer 103 and the upper cladding layer 104 was found to be about $2 \times 10^{10}$ cm$^{-2}$. The areal density of (111) twins drastically decreased and was found to be about $5 \times 10^7$ cm$^{-2}$ in a region in the vicinity of the surface of the upper cladding layer.

The orientation feature of each of epitaxially grown layers 102 to 104 was investigated through observation under a conventional transmission electron microscope (TEM). Specifically, TED patterns with respect to an incident electron beam parallel to the [110] direction of the (111) silicon single-crystal substrate 101 were captured. From the n-type (111) boron phosphide layer serving as the lower cladding layer 102, a reverse lattice pattern with respect to the (110) crystal plane was obtained, indicating that the [110] direction of the n-type (111) boron phosphide layer was aligned with the [110] direction of the silicon single-crystal substrate 101. The TED patterns also indicated that the p-type (111) boron phosphide layer (upper cladding layer 104) was grown such that the [110] direction was aligned with the [−2110] direction of the hexagonal Group III nitride semiconductor light-emitting layer 103.

After completion of the growth of the lower cladding layer 102, supply of phosphine (PH$_3$) gas employed for growing the lower cladding layer 102 to the growth system was gradually decreased from a flow rate of 430 cc/min to 0 cc/min over five seconds, rather than immediately stopping the supply. In order to investigate the effect of the above operation on the phosphorus atom concentration profile in the light-emitting layer 103, the phosphorus atom concentration profile in the light-emitting layer 103 in the thickness direction was analyzed through conventional SIMS. As a result, the well layer closest to the lower cladding layer 102 had a mean phosphorus atom concentration of about $9 \times 10^{19}$ cm$^{-3}$. The well layer present in the mid portion of the light-emitting layer 103 had a mean phosphorus atom concentration of about $2 \times 10^{19}$ cm$^{-3}$.

The well layer closest to the upper cladding layer 104 had a mean phosphorus atom concentration of about $6 \times 10^{18}$ cm$^{-3}$, indicating that the phosphorus atom concentration decreased in the thickness direction of the light-emitting layer 103.

On the entire surface of the p-type boron phosphide layer serving as the upper cladding layer 104 and also as a window layer through which emitted light is extracted, a gold-germanium (Au—Ge) alloy film, a nickel (Ni) film and a gold (Au) film were sequentially deposited through conventional vacuum vapor deposition. Subsequently, the metal films were selectively patterned through a known photolithographic technique such that the aforementioned tri-layer electrode having a bottom surface formed of the Au—Ge alloy film remained exclusively in the center portion of the upper cladding layer 104 where a p-type ohmic electrode 105 also serving as a pad electrode for wire bonding was to be provided. Other than the area where the p-type ohmic electrode 105 was provided, the metal films were removed through etching so as to expose the surface of the upper cladding layer 104. After removal of photoresist material, the cladding layer was selectively patterned again so as to provide lattice-pattern grooves for cutting the structure into chips. Thereafter, the thus formed lattice-pattern of the upper cladding layer 104 was exclusively removed through plasma dry etching employing a chlorine-containing halogen mixture gas to thereby form grooves for cutting the structure into chips.

On the entire backside of the silicon single-crystal substrate 101, a gold (Au) film was deposited through a conventional vapor deposition technique, and an n-type ohmic electrode 106 was formed from the gold film. The structure was cleaved along the aforementioned slip-like grooves having a line width of 50 μm and being provided parallel to the [110] direction normal to the (111) surface of the silicon single-crystal substrate 101, thereby producing square (350 μm×350 μm) LED chips 10.

Emission characteristics of the LED chips 10 were evaluated when forward device operation current (20 mA) was caused to flow between the p-type ohmic electrode 105 and the n-type ohmic electrode 106. The LED chips 10 were found to emit blue light having a wavelength of 440 nm. The half width of an emission peak observed in an emission spectrum was found to be 220 meV. The luminance of the light emitted from each chip before resin-molding, as determined through a typical integrating sphere, was 10 mcd. The forward voltage (Vf) at a forward current of 20 mA was found to be as low as 3.1 V, whereas the reverse voltage at a reverse current of 10 μA was found to be as high as 9.5 V. Virtually no local breakdowns were observed.

INDUSTRIAL APPLICABILITY

As described hereinabove, according to the present invention, a light-emitting layer composed of a (0001) Group III nitride semiconductor is caused to be joined with a (111) boron phosphide-based semiconductor layer containing (111) twins which mitigate lattice-mismatch with a silicon substrate or a similar material, in the case where a boron phosphide-based semiconductor light-emitting device is fabricated from a boron phosphide-based semiconductor layer grown on a highly lattice-mismatch silicon single-crystal substrate. Therefore, a light-emitting layer having high crystallinity can be produced, and a boron phosphide-based semiconductor light-emitting device fabricated from the light-emitting layer can emit high-intensity light.

In addition, the upper cladding layer which is joined with a light-emitting layer composed of a (0001) Group III nitride semiconductor and which also serves as a window layer is formed from a low-lattice-strain (111) boron phosphide semiconductor layer containing (111) twins which layer is oriented such that the [110] direction is aligned with the [−2110] direction of the light-emitting layer. Therefore, boron phosphide-based semiconductor LEDs and similar devices exhibiting excellent blocking voltage characteristics with few local breakdowns can be provided.

The invention claimed is:

1. A boron phosphide-based semiconductor light-emitting device comprising:
a substrate of silicon single crystal;
a first cubic boron phosphide-based semiconductor layer that is provided on a surface of the substrate and contains twins;
a light-emitting layer that is composed of a hexagonal Group III nitride semiconductor and provided on the first cubic boron phosphide-based semiconductor layer, said light-emitting layer having a multi-quantum well structure comprising a plurality of well layers; and
a second cubic boron phosphide-based semiconductor layer that is provided on the light-emitting layer, contains twins and has a conduction type different from that of the first cubic boron phosphide-based semiconductor layer,
wherein the light-emitting layer has a profile of phosphorus atom concentration that monotonically decreases from a bottom to a top thereof in a thickness direction such that the phosphorus atom concentration among the plurality of well layers is highest for the well layer closest to the substrate and is lowest for the well layer farthest from the substrate, and
a phosphorus atom concentration at a bottom of the light-emitting layer is $5 \times 10^{18} cm^{-3}$ to $2 \times 10^{20} cm^{-3}$.

2. A boron phosphide-based semiconductor light-emitting device according to claim 1, wherein the substrate is a (111)-silicon single-crystal substrate having a (111) crystal plane, and the first cubic boron phosphide-based semiconductor layer is provided on the (111) crystal plane.

3. A boron phosphide-based semiconductor light-emitting device according to claim 2, wherein the first cubic boron phosphide-based semiconductor layer has a [110] direction aligned with a [110] direction of the silicon single crystal.

4. A boron phosphide-based semiconductor light-emitting device according to claim 2, wherein the first cubic boron phosphide-based semiconductor layer contains (111) twins having a (111) crystal plane serving as a twinning plane in a junction area in contact with the (111) crystal plane of the (111)-silicon single-crystal substrate.

5. A boron phosphide-based semiconductor light-emitting device according to claim 1, wherein, the first cubic boron phosphide-based semiconductor layer is an undoped layer to which no impurity element has been intentionally added.

6. A boron phosphide-based semiconductor light-emitting device according to claim 1, wherein the light-emitting layer has a [−2110] direction aligned with a [110] direction of the first cubic boron phosphide-based semiconductor layer and has a (0001) crystal plane serving as a front surface.

7. A boron phosphide-based semiconductor light-emitting device according to claim 6, wherein the second cubic boron phosphide-based semiconductor layer has a [110] direction aligned with the [−2110] direction of the light-emitting layer.

8. A boron phosphide-based semiconductor light-emitting device according to claim 6, wherein the second cubic boron phosphide-based semiconductor layer contains (111) twins having a (111) crystal plane serving as a twinning plane in a junction area in contact with the (0001) crystal plane of the light-emitting layer.

9. A boron phosphide-based semiconductor light-emitting device according to claim 6, wherein the second cubic boron phosphide-based semiconductor layer is an undoped layer to which no impurity element has been intentionally added.

10. A boron phosphide-based semiconductor light-emitting device according to claim 1, wherein the first and second cubic boron phosphide-based semiconductor layers exhibit a bandgap at room temperature of 2.8 eV or more.

11. A boron phosphide-based semiconductor light-emitting device according to claim 1, wherein the first and second cubic boron phosphide-based semiconductor layers are provided so as to serve as cladding layers.

12. A boron phosphide-based semiconductor light-emitting device according to claim 1, wherein the second cubic boron phosphide-based semiconductor layer is provided so as to serve as a window layer which allows passage of light emitted from the light-emitting layer to the outside.

13. A boron phosphide-based semiconductor light-emitting device according to claim 1, wherein the second cubic boron phosphide-based semiconductor layer is provided so as to serve as a current-diffusion layer which allows device operation current to diffuse.

14. A boron phosphide-based semiconductor light-emitting device according to claim 1, wherein the second cubic boron phosphide-based semiconductor layer is provided so as to serve as a contact layer for forming an electrode.

* * * * *